United States Patent [19]
Robinson

[11] Patent Number: 6,052,729
[45] Date of Patent: Apr. 18, 2000

[54] EVENT-REACTION COMMUNICATION PROTOCOL IN AN OBJECT ORIENTED PROCESSOR ARRAY

[75] Inventor: Jeffrey I. Robinson, New Fairfield, Conn.

[73] Assignee: IQ Systems, Inc., Sandy Hook, Conn.

[21] Appl. No.: 09/004,174

[22] Filed: Jan. 7, 1998

Related U.S. Application Data

[60] Provisional application No. 60/036,526, Jan. 28, 1997.

[51] Int. Cl.⁷ ..................................................... G06F 13/00
[52] U.S. Cl. .......................... 709/224; 709/223; 709/226
[58] Field of Search ..................................... 710/260, 261, 710/263, 264; 709/200–203, 208, 223–225, 232, 235, 226

[56] References Cited

U.S. PATENT DOCUMENTS

| | | | |
|---|---|---|---|
| 4,050,097 | 9/1977 | Miu et al. | 364/200 |
| 4,200,936 | 4/1980 | Borzcik et al. | 364/900 |
| 4,357,658 | 11/1982 | van der Ouderaa | 364/200 |
| 4,488,226 | 12/1984 | Wagner, Jr. et al. | 364/200 |
| 5,036,459 | 7/1991 | den Haan et al. | 364/200 |
| 5,095,522 | 3/1992 | Fujita et al. | 395/200 |
| 5,165,018 | 11/1992 | Simor | 395/300 |
| 5,259,002 | 11/1993 | Carlstedt | 375/38 |
| 5,276,807 | 1/1994 | Kodama et al. | 395/200 |
| 5,361,376 | 11/1994 | Cummin et al. | 395/800 |
| 5,398,336 | 3/1995 | Tantry et al. | 395/600 |
| 5,408,501 | 4/1995 | Cornaby | 375/260 |
| 5,410,723 | 4/1995 | Schmidt et al. | 395/800 |
| 5,430,850 | 7/1995 | Papadopoulos et al. | 395/375 |
| 5,557,744 | 9/1996 | Kobayakawa et al. | 709/232 |
| 5,634,070 | 5/1997 | Robinson | 395/800 |
| 5,687,326 | 11/1997 | Robinson | 395/285 |
| 5,708,838 | 1/1998 | Robinson | 395/800 |
| 5,717,614 | 2/1998 | Shah et al. | 702/119 |
| 5,892,957 | 4/1999 | Normoyle et al. | 210/263 |

OTHER PUBLICATIONS

Pradeep K. Sinha, "Distributed Operating Systems: Concepts and Designs", IEEE, pp. 1–16, Dec. 1996.

*Primary Examiner*—Zarni Maung
*Attorney, Agent, or Firm*—David P. Gordon; David S. Jacobson; Thomas A. Gallagher

[57] ABSTRACT

An object oriented processor array includes a library of functional objects which are instantiated by commands through a system object and which communicate via a high level language. According to the invention, communication is based on an "event-reaction" model. According to the event-reaction model, when a processor object has a message to send, it generates a data event which is registered with the target recipient of the message (usually the host). The target reacts to the event by allowing a variable amount of I/O exchange between the processor object and the target prior to an acknowledgement of the data event. According to one embodiment, until the data event is acknowledged, no other data event may be sent to the target. According to another embodiment, a fixed number of data events may be pending simultaneously. In one embodiment of a multi-node system, each node (each object oriented processor array) is aware of network traffic and data events related to a particular target (host) receiver are registered with all nodes which have that receiver as a target as well as with the target. The number of data events which may be simultaneously pending at any time is determined by the target and known to each of the nodes. The target arbitrates the flow of messages based on the registration of data events.

10 Claims, 5 Drawing Sheets

FIG.5

| t1 | t2 | t3 | t4 | t5 | t5+n | t5+m |
|---|---|---|---|---|---|---|
| [data Event] | | | | | | ...[data Event] |
| | {cmd Event | {cmdAck | {cmd Event | | [dataAck] | |
| | | | | {cmd Ack | | |

FIG.6

| t1 | t2 | t3 | t4 | t5 | t6 | t7 | t8 | t9 |
|---|---|---|---|---|---|---|---|---|
| [dataEvent 1] | [dataEvent 2] | | | | | [dataEvent 1] | | |
| | | {cmdEvent1 | | ]dataAck1 | {cmdEvent2 | | | ]dataAck2 |
| | | | {cmdAck1 | | | | {cmdAck2 | |

EVENT-REACTION COMMUNICATION PROTOCOL IN AN OBJECT ORIENTED PROCESSOR ARRAY

This application claims the benefit of provisional application Ser. No. 60/036,526 filed Jan. 28, 1997 for "Object Oriented Processors With Enhanced Application Directed Flexibility".

This application is related to application Ser. No. 08/525,948, filed Sep. 8, 1995 for "Distributed Processing Systems Having A Host Processor And At Least One Object Oriented Processor" and application Ser. No. 08/683,625, filed Jul. 17, 1996 for "Method And Apparatus For Distributed Processing And Rapid ASIC Development", the complete disclosures of which are hereby incorporated by reference herein in their entireties.

This application is also related to co-pending applications Ser. No. 09/003,684 for "Object Oriented Processor Arrays" (IQS-013), and Ser. No. 09/003,993 for "Central and Distributed Script Servers in an Object Oriented Processor Array" (IQS-015), both filed simultaneously herewith, and the complete disclosures of which are hereby incorporated by reference herein.

BACKGROUND OF THE INVENTION

1. Field of the Invention

The invention relates to object oriented processors and processor systems. More particularly, the invention relates to an object oriented processor or processor system which utilizes an event-reaction communication protocol through which processor objects communicate, and which is controlled by a high level scripting language.

2. State of the Art

Modern computers permit seemingly simultaneous execution of many operations by interrupting the microprocessor periodically to execute several software threads in turn. For example, as a user types on a keyboard, the input from this peripheral to the microprocessor is seemingly simultaneously displayed by the microprocessor on a video display peripheral. In reality, the microprocessor is interrupted periodically from displaying output on the video display in order to obtain input from the keyboard. It is only because the microprocessor operates at a very high speed that there is an illusion of simultaneity. In a more complex processing system, there may be many threads vying for microprocessor attention at any time. For example, in a desktop multimedia computer, several peripheral devices must be controlled by the microprocessor in a seemingly simultaneous manner in order to produce the proper results and different operations such as displaying video and playing audio must be handled by separate threads. The programming environment in a system having so many threads is incredibly complex. The system software must be written to schedule microprocessor attention to each thread, assign priority to each thread and allow peripherals to interrupt the microprocessor at appropriate times. The system software must then schedule tasks for the microprocessor in response to the interrupts from various peripherals.

In addition to scheduling problems, software in a multitasking (multi-threaded) system is difficult to debug. Single stepping techniques cannot be used, since different threads may depend on the results of other threads, and only a single thread can be operational during single stepping.

The handling of interrupts by the microprocessor is determined in part by the bus protocol and in part by the design of the microprocessor itself. Typically, the bus is designed to work with a particular microprocessor or group of microprocessors; and peripheral devices are designed to work with a particular bus. Moreover, each microprocessor-bus system handles interrupts in a different way. This makes it difficult, if not impossible, to adapt program code used on one microprocessor-bus system for use on another.

In order to relieve the host processor from performing every task, multiprocessor systems have been proposed. Some multiprocessor systems are successful in dividing tasks among processors when the tasks are well defined. For example, it is not uncommon to divide tasks between a data processor and a signal processor in systems which deal with signals and data in real time. It is more difficult to divide data processing tasks among several data processors. The operating system must decide which tasks will be performed by which processor and must schedule tasks so that processors do not remain idle while waiting for new tasks or while waiting for other processors to complete tasks so as to provide needed results. Consequently, there has been very little success in developing a general purpose multiprocessor system and there is no standard programming language for programming a multiprocessor system.

U.S. Pat. No. 5,095,522 to Fujita et al. discloses an object-oriented parallel processing system which utilizes "concept objects" and "instance objects". The system utilizes a host processor and a plurality of general purpose processors which are programmed by the host processor. The host user must program (generate concept and instance objects) for each processor before parallel processing can begin. Fujita et al. considers this aspect of their system to be a feature which allows dynamic changes in the functionality of each of the processors. However, this aspect of their system greatly complicates the host processor software.

Similarly, U.S. Pat. No. 5,165,018 to Simor describes a system in which "nodes" are provided with generic configuration rules and are configured at runtime via resource definition messages from the control node. Simor considers this aspect of his system to be an advantage which, among other things, "isolates the hardware from the software" and "allows programs to be written as if they were going to be executed on a single processor." In addition, Simor's system permits programs to be "distributed across multiple processors without having been explicitly designed for that purpose."

Both Fujita et al. and Simor utilize general purpose processors and attempt to isolate the hardware from the software, freeing the programmer to write code as if it were being executed on a single processor. However, as mentioned above, writing multithreaded software for a single processor is very complex. Neither Fujita et al. nor Simor offer any solution for this complexity.

3. Related Inventions

Related application Ser. No. 08/525,948 approaches the problem of distributed processing in a manner which is completely different from that of either Fujita et al. or Simor. The system disclosed in the '948 application utilizes processors which have been pre-programmed with functionality for a specific purpose and thereby integrates hardware with software. The developer chooses specific hardware (object oriented processors) in a manner similar to choosing specific software objects. This approach requires that the developer be very aware of the hardware used in the system, but frees the developer from writing much of the code used to implement the system. Accordingly, the developer need only write a minimal amount of relatively high level code to link the pre-programmed object oriented processors which contain statically stored code for performing specific tasks. This approach is based on the belief that writing and de-bugging code is more time consuming and more expensive than linking together processors which contain pre-written, bug-free code. This approach enables rapid system development, relieves the host processor of many scheduling tasks, simplifies de-bugging, enables cross-platform support, allows software emulation of hardware devices, as well as providing other advantages.

According to the '948 application, object oriented processors communicate with each other and/or with the host processor via the exchange of high level messages. This earliest implementation of the communication protocol required that the host poll at least some of the object oriented processors (i.e. those responsible for processing input data) to determine the availability of data. This was eventually found to detract from the goal of simple coding as the host code had to be written in a manner that would scan all possible input sources on a frequent basis. It was eventually decided that this polling created an undesirable overhead and coding complication. Since many of the originally developed object oriented processors operated in real time, the polling scan rate could be high and thus the overhead could be substantial. In addition, the early communication protocol did not provide information about the source of the data. This was instead derived by specific information requests by the host. Thus, several message exchanges might have been required before both data and source were determined.

Related application Ser. No. 08/683,625 discloses a distributed processing system one or more object oriented processors are embodied as a collection of components on a single ASIC chip. This related application includes an enhanced communication language where the host need not poll the object oriented processors and where messages from one processor to another include source and destination addresses. This communication protocol can be said to be "event driven". During subsequent development of this event driven communication architecture, it was determined that programming the event driven model was somewhat complex and that communication bandwidth was not readily conserved.

SUMMARY OF THE INVENTION

As used herein, the term "object oriented processor array" means a collection of object oriented processors where each object oriented processor incorporates a separate hardware processor, or a collection of object oriented processors where each object oriented processor is embodied as a virtual processor sharing the same hardware processor, or any combination of discrete hardware processors and virtual processors.

It is therefore an object of the invention to provide an object oriented processor array with enhanced post-manufacture configurability.

It is an additional object of the invention to provide an object oriented processor array which utilizes an enhanced communication protocol which conserves bandwidth and allows the developer/user to choose a level of coding simplicity in exchange for object latency.

In accord with these objects which will be discussed in detail below, an object oriented processor array of the present invention includes a readable memory containing a library of configurable (programmable) functions (also referred to as objects) and a writable memory in which objects are instantiated and configured. More specifically, the object oriented processor array includes a system functionality (system object) which is automatically instantiated in writable memory at power-up, which calls other objects to be instantiated in writable memory in response to commands from a host processor or a boot ROM, and which maintains an active task list and other information about instantiated objects. The object oriented processor array according to the invention further includes a communications interface, an input message processor, and an output message processor. The communications interface allows the object oriented processor array to communicate with other object oriented processor arrays and/or with a host processor. The output message processor preferably includes an external output flow manager for handling messages from processor objects in the array to processor objects external of the array, and a central output registry for queuing messages. According to a presently preferred embodiment, the object oriented processor array is embodied as a virtual machine which is formed from software which runs on a microprocessor. Therefore, the software which embodies the object oriented processor array is provided with a timing kernel which simulates parallelism and a memory manager which allocates memory to objects when they are instantiated.

According to a presently preferred embodiment of the invention, the library of functions is configured as a library of objects stored in ROM. Each object includes a parser layer, a functional layer (which preferably includes a runtime layer and a background layer), a time layer, and an instantiation layer. The system object is also stored in ROM and is automatically instantiated in RAM when the processor array is powered on, and in a preferred embodiment of the invention, reserves RAM for an active task list table (function pointers to instantiated objects), an active task list name table (the names of the instantiated objects), and an active task list data space (pointers to the allocated memory blocks for each instantiated object).

The instantiated object arranges its allocated RAM in several parts. The first part is the output message header which includes a pointer to the output buffer of the object instantiation, the message length, the active task list index, the flow priority of the cell instantiation, the message type, and the source ID. This first part is common in all objects, i.e. every instantiated object has this part in its allocated RAM. The second part is private data used by the cell in the performance of its functionality. This second part may be different for each instantiated object and some objects may arrange additional parts of allocated RAM.

According to a presently preferred embodiment, a flow priority of 0–7 may be assigned to each instantiated object where 0 represents polled priority and 1–7 indicate increasing levels of importance. When the priority level is greater than zero, output messages from the object will be generated autonomously. The flow priority is stored by the instantiation of an object in its output message header part of RAM.

During operation, a message to a particular instantiation of an object is parsed by the input message processor which scans the active task list name table to find the index to the active task list the pointer to the object instantiation addressed. The object receives the message from the input message processor and the index. The object uses the index and the active task list data space table to find which instantiation of itself is being addressed. Messages from an instantiation of an object are placed in the output message header part of its RAM and a request for registration is sent to the central output registry. The output registry maintains a queue of pointers to messages in output message header parts. The queue is scanned by one or more output flow managers which form output messages from the information held in the output message header parts. According to the invention, the flow of messages is based on an event-reaction architecture.

The event-reaction architecture for message flow is a flexible method of assigning priority to multiple bus users which conserves bandwidth and simplifies host processor programming. According to the event-reaction model, when a processor object has a message to send, it generates a data event message which is registered with the target recipient of the message (usually the host). The target reacts to the event by allowing a variable amount of I/O exchange between the processor object and the target prior to an acknowledgement that all of the data related to the data event has been received. According to one embodiment, until the data event is acknowledged, no other data event may be sent to the target. According to another embodiment, a fixed number of data events may be pending simultaneously. In one embodiment of a multi-node system, each node (each object oriented processor array) is aware of network traffic and data events related to a particular target (host) receiver are registered with all nodes which have that receiver as a target as well as with the target. The number of data events which may be simultaneously pending at any time is determined by the target and known to each of the nodes. The target arbitrates the flow of messages based on the registration of data events. Arbitration may be on a FIFO basis or the targeted receiver may grant priority to later generated data events which have a higher flow priority. As mentioned above, the output message buffers of the instantiated objects provide for a message flow priority. The event reaction model permits the host code to be linear with the number of threads in the host code depending on the number of pending data events permitted.

According to other preferred aspects of the invention, a high level language is provided for communication between object oriented processors and a host processor during set-up and during operation. The high level language according to the invention includes support for the event-reaction protocol, an efficient addressing scheme, better use of bandwidth and simplified host parsing. According to a presently preferred embodiment, the high level language messages are exchanged in packets of variable length with a well defined header. The header includes addressing information, an indication of the type of message which follows, an indication of the method or data type, and an indication of the length of the remaining data in the packet. The high level language is self-aligning, simple, and robust.

As mentioned above, the object oriented processor arrays according to the invention are embodied in many alternative constructions including running software on a microprocessor, field programmable gate arrays, multiple microprocessors, and other hardware devices.

Additional objects and advantages of the invention will become apparent to those skilled in the art upon reference to the detailed description taken in conjunction with the provided figures.

BRIEF DESCRIPTION OF THE DRAWINGS

FIG. 5 is a chart illustrating a first embodiment of the event-reaction protocol of the invention; and FIG. 6 is a chart illustrating a second embodiment of the event-reaction protocol of the invention.

BRIEF DESCRIPTION OF THE APPENDICES

Appendix A is an exemplary source code listing for the timing kernel which includes Main1001.c, and Timer2.c;

Appendix B is an exemplary source code listing for the communications interface and message processors which includes Globals.h, Comms.c, Imsgproc.c, and Omsgproc.c; and Appendix C is an exemplary source code listing for an exemplary processor object (Enc4.c).

DETAILED DESCRIPTION OF THE PREFERRED EMBODIMENTS

Figure 1:
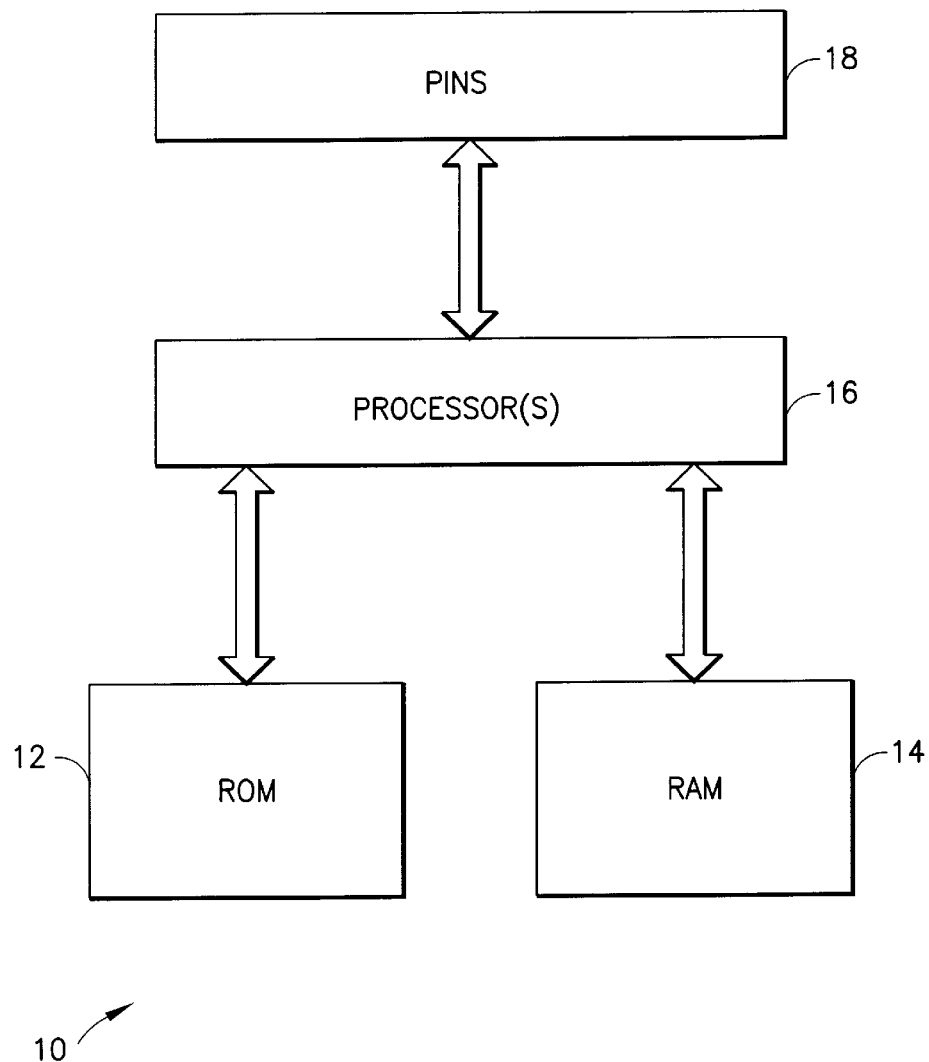
FIG. 1 is a schematic block diagram of the major hardware components of an object oriented processor array according to the invention.

Referring now to FIG. 1, an object oriented processor array 10 according to a presently preferred embodiment of the invention includes a readable memory 12, a writable memory 14, one or more programmable processors 16 coupled to the memory 12 and 14, and a real world interface such as a number of pins 18 which are coupled to the processor(s) 16. As shown and described in further detail below, one embodiment of the invention resides on a single chip which includes a single general purpose microprocessor, RAM and ROM and which has a number of pins. Those skilled in the art will appreciate, however, that the functional aspects of the invention may be embodied using many different types of hardware and/or software.

Figure 2:
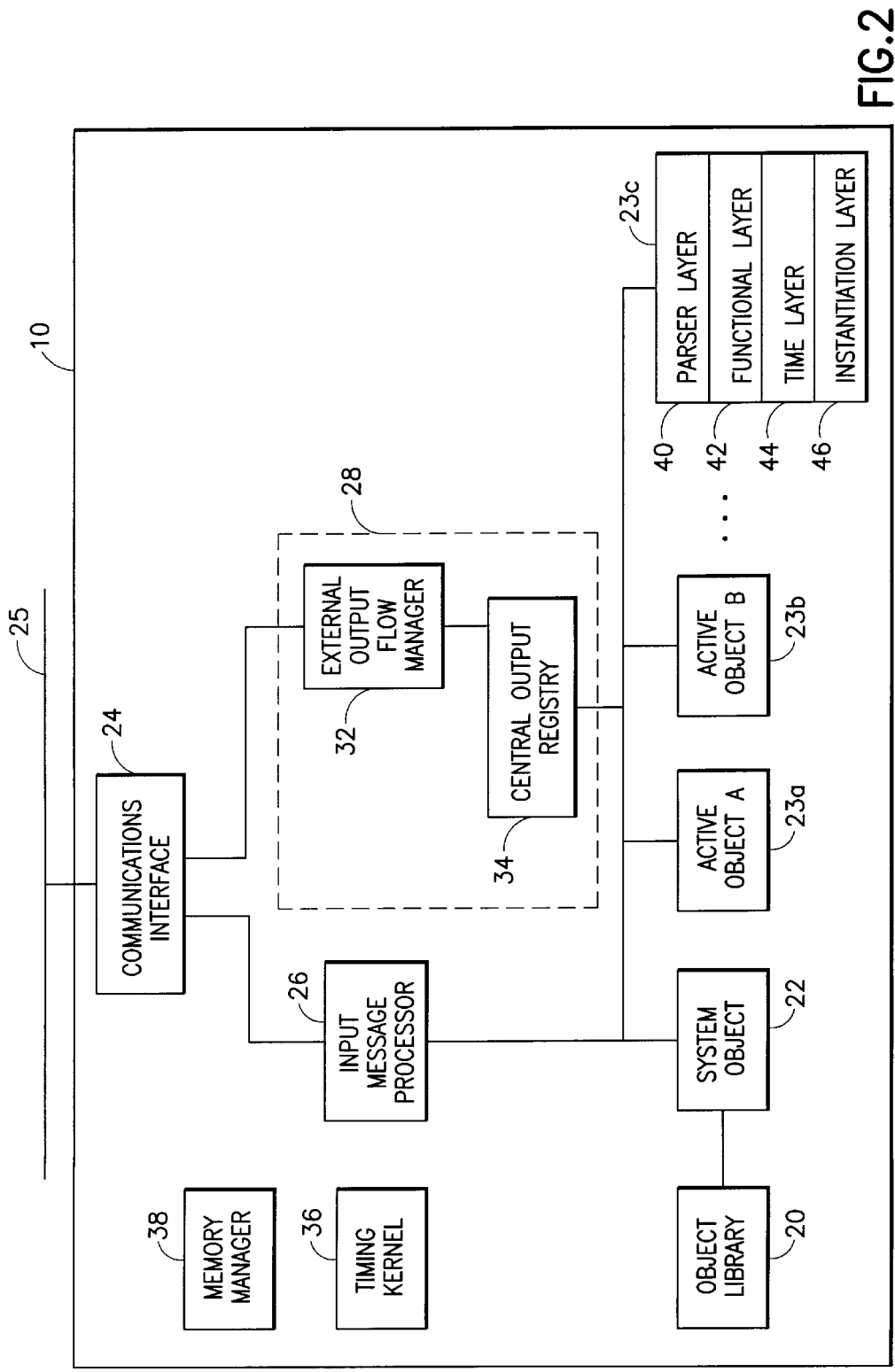
FIG. 2 is a schematic block diagram of the major functional components of an object oriented processor array according to the invention.

Turning now to FIG. 2, and with reference to FIG. 1, the readable memory 12 contains a library 20 of configurable (programmable) functions (also referred to as objects) which are instantiated and configured in the writable memory 14 as described in co-pending Ser. No. 09/003,684 (IQS-013). More specifically, the object oriented processor array 10 includes a system object 22 which is automatically instantiated in writable memory at power-up, which calls other objects from the library 20 to be instantiated in writable memory 14 in response to commands from a host processor or a boot ROM as described in more detail below. Once an object has been instantiated, it appears as an active object, e.g. 23a, 23b, 23c, in the processor array 10. The object oriented processor array 10 further includes a communications interface 24, an input message processor 26, and an output message processor 28. The communications interface 24 allows the array of active objects 23a–23c to communicate with other object oriented processor arrays and/or with a host processor via a communications link or bus 25 (which may be in the form of a physical bus, a multi-ported memory or even a radio link). The communications interface also allows the system object 22 to receive commands from a host or boot ROM. The input message processor 26 is responsible for routing and basic syntax parsing of incoming messages. Once the message is received and deemed syntactically correct, it is routed to the parser layer of the addressed object as discussed below. The output message processor 28 preferably includes an external output flow manager 32 for handling messages from active objects in the array 10 to processors external of the array 10, and a central output registry 34 for queuing messages. All input to the output message processor 28 is through the central output registry 34. As described in more detail below, upon the occurrence of an event within an object, the object calls the central registry 34 and provides a handle to a standard structure which is entered into the output queue. The output queue is scanned by the flow manager which looks for information on the output queue and the priority the object has been assigned, if any. Once a flow manager determines which object has subsequent use of the port, it consructs a message using information in the standard structure which determines the message type (e.g. data event, command ack, etc.), the name of the object that originated the message, the type or source of the data, and any data associated with the message which is derived by referencing a pointer. The newly composed message is then sent to the output port and transmitted.

As mentioned above, according to one embodiment, the object oriented processor array 10 is embodied as a virtual machine which is formed from software which runs on a microprocessor. Therefore, the software which embodies the object oriented processor array 10 is provided with a timing kernel 36 which simulates parallelism and a memory manager 38 which allocates memory to objects when they are instantiated. It will also be appreciated that when the object oriented processor array 10 is embodied as a virtual machine, the interconnections among the elements shown in FIG. 2 are not physical connections, but rather indicative of the functional relationships among the elements.

Figure 3:
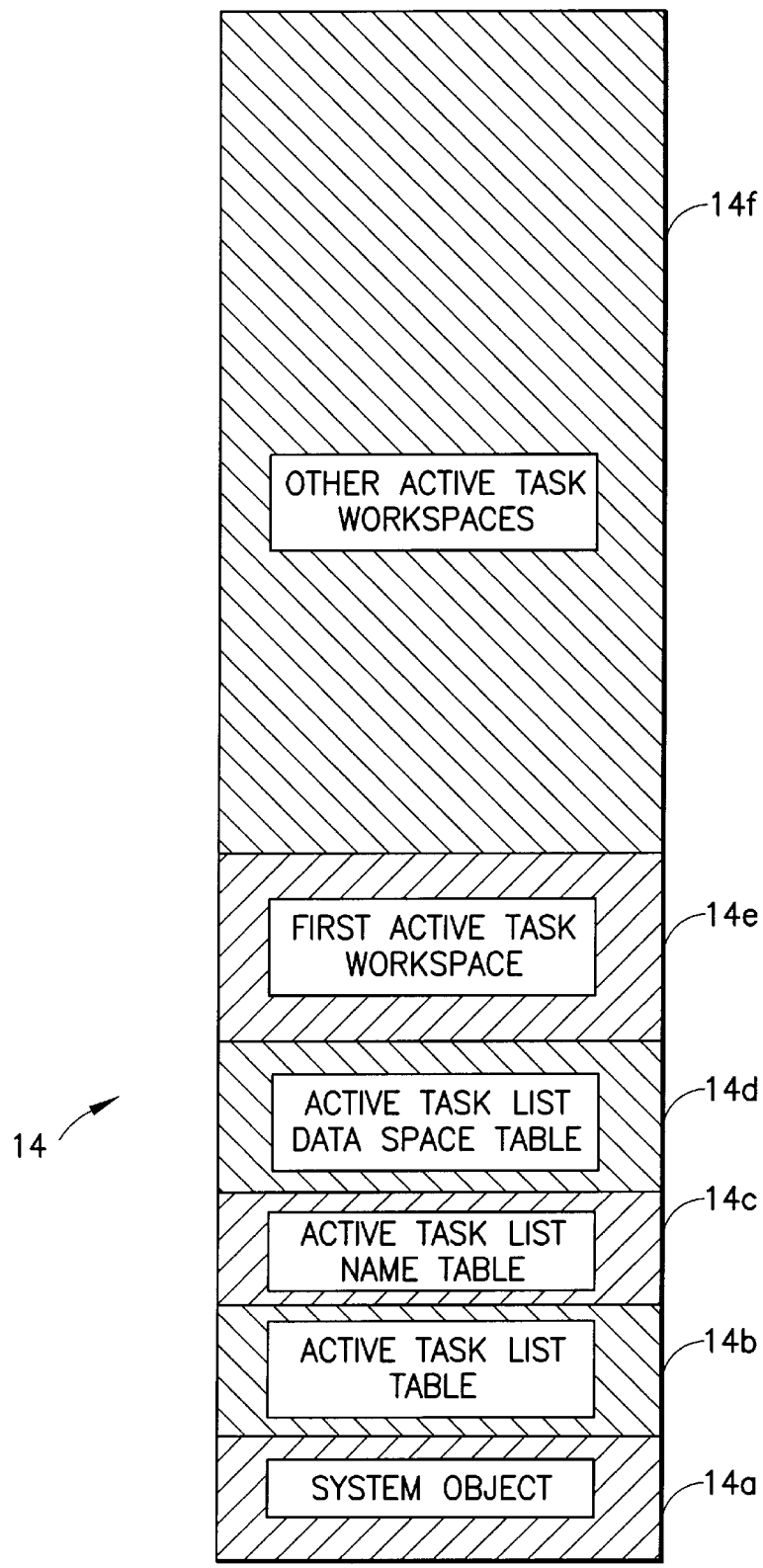
FIG. 3 is a schematic memory map of the writable memory area in the object oriented processor array of FIGS. 1 and 2.

Referring now to FIGS. 2 and 3, each object, e.g. 23c, includes a parser layer 40, a functional layer 42, a time layer 44, and an instantiation layer 46. The parser layer contains the intelligence to interpret the vocabulary pertinent to the particular object and to perform tasks which may be performed immediately. As mentioned above, each object has a certain predefined functionality which is configurable. The vocabulary for each object, therefore, will be governed somewhat by the functionality which the object contains and will also include some general purpose vocabulary for communication. Examples of how the vocabulary of each object may be different is shown in related application Ser. No. 08/525,948. The parser layer is the means by which an instantiated object is initialized and configured, and the means by which the object receives messages. The functional layer 42 contains all of the intelligence needed to carry out the predefined functionality of the object and is preferably divided into a runtime layer and a background layer. The runtime layer contains the functionality which needs to be executed on a continual basis and the background layer contains the functionality for relatively low priority tasks. For example, if the object is coupled to an input device, scanning the input device would be part of the runtime layer. The functions performed in the background layer usually take a long time to execute such as low speed communications dialog with a device socket. The time layer 44 participates in the scheduling of the runtime layer by providing information to the system object 22 about the dynamic performance and behavior of the particular object as described more fully below. The instantiation layer 46 performs the tasks needed to instantiate the object when called by the system object as described more fully below.

As mentioned above, all of the objects, e.g. 23a–23c, are preferably stored in ROM. The system object 22 is also preferably stored in ROM and is automatically instantiated when the processor array 10 is powered on. The instantiation of the system object 22 includes reserving a portion 14a of RAM 14 for itself and reserving portions of RAM 14 for an active task list table 14b (function pointers to instantiated objects), an active task list name table 14c (the names of the instantiated objects), and an active task list data space 14d (pointers to the allocated memory blocks for each instantiated object). The system object 22 is similar to other objects but handles global methods and functions which are common to all objects (e.g., turning exception on/off, returning shell status, etc.—"shell status" includes, e.g., the number of events pending, the number of acknowledgements pending, etc.) and essentially consists of a parser layer only. The primary function of the system object is calling other objects to be instantiated.

The initialization and configuration of the object oriented array is described in greater detail in co-pending Ser. No. 09/003,684 (IQS-013). In addition, some details of the initialization and configuration of the object oriented array may be gleaned from the attached Appendices A–C.

Figure 4:
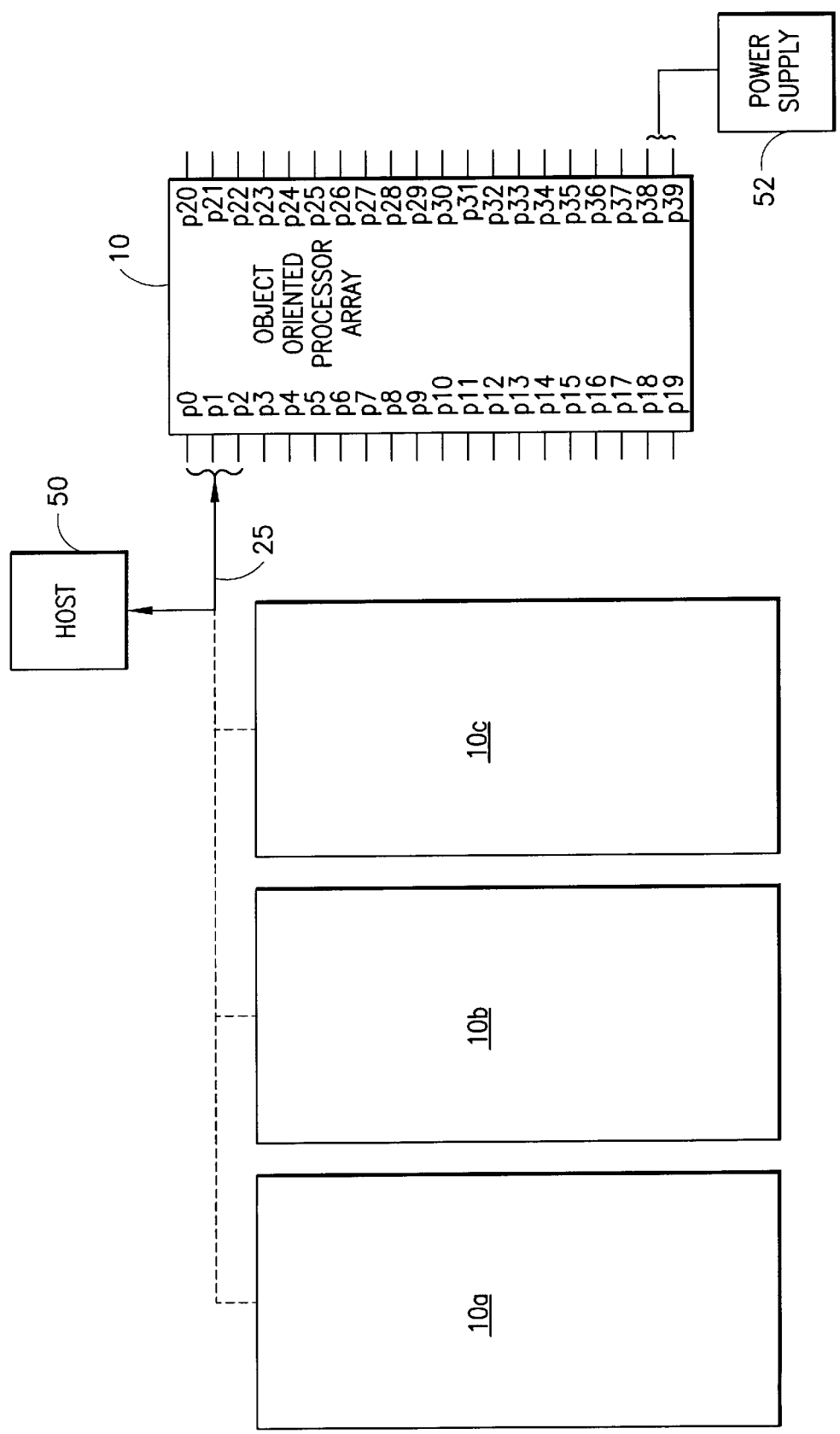
FIG. 4 is a schematic block diagram of an object oriented processor array according to the invention coupled to a host processor and a power supply.

Turning now to FIG. 4, a presently preferred embodiment of the object oriented processor array 10 is contained on a single chip having a plurality of pins, e.g., p0 through p39. Three pins, e.g. p0, p1, and p2 are preferably reserved for a communications link with a host processor 50 and additional object oriented processor arrays, e.g. 10a–10c, via a network link 25; and two pins, e.g. p38 and p39 are preferably reserved for connection to a DC power source 52. According to the presently preferred embodiment, the three pins are used to implement the communications network described in co-owned, co-pending application Ser. No. 08/645,262, filed May 13, 1996, the complete disclosure of which is incorporated by reference herein. In some instances, however, it may be advantageous to provide discrete point-to-point links between the host 50 and each array 10, 10a–10c, e.g., when the arrays are physically removed from each other by substantial distance, when the arrays are operating at substantially different speeds, or when only one array is used. In these situations, only two pins will be needed to support the link and one may use the point-to-point communication methods disclosed in co-owned, co-pending application Ser. No. 08/545,881, filed Oct. 20, 1995, the complete disclosure of which is incorporated by reference herein. It should also be noted that the host processor may also be coupled to other conventional microprocessors and/or peripheral devices to create a system which includes both distributed object oriented processing with traditional microprocessor systems.

According to the invention, the host processor 50 is used to configure the object oriented processor arrays 10, 10a–10c utilizing a high level command language and is preferably also used to communicate with the object oriented processor arrays during normal operations. According to the invention, communications between object oriented processor arrays 10, 10a–10c and the host are managed according to an "event-reaction" model.

When several object oriented processor arrays are coupled to a single host, the host may be required to participate in many concurrent dialogs with the several object oriented processor arrays. Each concurrent dialog requires a separate thread in the host. However, the event-reaction model relieves the developer from the task of writing complicated multithreaded host code. In addition, objects in an object oriented processor array which are coupled to input devices can generate data events at a rate faster than the host can (or desires to) process them. For example, the rotation of a rotary encoder may cause a data event every time the encoder is advanced one detent. This could result in a significant amount of redundant computation and communication. The event-reaction model solves this problem by allowing the host to control when data is sent to it. According to the event-reaction model of the invention, when an object within an array 10 has a message to send, it generates a "data event" message. More particularly, when an object within a processor array has a message to send, it is registered with the output message processor 28 in FIG. 2 which controls the priority of objects within an array 10 and which outputs messages via the communications interface 24 to the communications bus 25. As mentioned above, and as will be appreciated by those skilled in the art, the means for generating the "data event" may include a variety of hardware and/or software components which cause a message to be written onto the bus 25. For example, when an object oriented processor array 10 is embodied as a single processor chip with different objects embodied in software on the chip, the means for generating the "data event" may include software code which controls a UART on the chip to write a message to the bus 25.

The data event is registered with the host 50 and with the output message processors of each array 10, 10a–10c which is coupled to the host 50 via the bus 25. More particularly, the host 50 is provided with a memory for at least temporarily storing the data event. The arrays 10, 10a–10 c are provided with a memory for storing at least the fact that a data event has been registered with the host. As described in more detail below, this memory in the arrays need only keep track of the number of data events which are pending and thus can be implemented as a simple counter and a filter which increments or decrements the counters based on messages which appear on the bus. The host 50 reacts to the data event by allowing a variable amount of I/O exchange between the object and the host prior to sending an acknowledgement onto the bus 25 that all data has been received. It will be appreciated that the means by which the host exchanges information with the object may include a variety of different hardware and software components. For example, where the host is embodied as a single chip processor programmed with software, the means by which the host exchanges messages with the object may include a UART on the chip and software to control the UART.

According to one mode of operation, until an acknowledgement is generated that all data relating to the data event has been received, no other data event may be sent to the host 50 from any object on any of the arrays 10, 10a–10c. For example, whenever a data event is placed on the bus, all of the objects coupled to the bus will increment the counter which is operated by the filter which detects data events on the bus. So long as the counter equals ONE, none of the objects will attempt to send a data event to the host. When the host acknowledges the completion of data reception, the filters will see this acknowledgement and decrement the counters to ZERO. All of the objects will then know that the bus is available.

According to another mode of operation, a fixed number of data events may be pending simultaneously. The number of data events which may be pending simultaneously is determined by the host 50, and each of the arrays is configured when they are initialized by the host so that their output message processors know how many pending events are allowed at any one time. For example, if a counter is used as described above, the counter may be incremented to a number defined by the host when the system is configured. Alternatively, the maximum counter value may be set in other ways. Preferably, the output message processor in each array keeps a counter of the pending data events. When a data event is generated, the counter is incremented, and when completion of a data transfer regarding a data event is acknowledged, the counter is decremented. Those skilled in the art will appreciate that the number of pending data events which are allowed will determine the number of threads which need to run on the host.

When multiple object oriented processor arrays are coupled to a host by a bus, each processor array is aware of network traffic, and data events related to a particular target receiver are registered with all arrays. The number of data events which may be simultaneously pending at any time is determined by the target and is known to each of the arrays. The target arbitrates the flow of messages based on the registration of data events. Arbitration may be on a FIFO basis or the targeted receiver may grant priority to later generated data events which have a higher flow priority (if the number of allowed pending data events is more than one). As mentioned above, the output message buffers of the instantiated objects provide for a message flow priority. The event reaction model permits the host code to be linear with the number of threads in the host code depending on the number of pending data events permitted.

When a number of object oriented processor arrays coupled to a host by individual links rather than a common bus, the host communicates with each array according to the message flow priorities of the cells in the array. The number of threads in the code on the host depends on the sum of the number of pending data events permitted in each object oriented processor array.

An example of the event-reaction model (where the maximum number of pending data events is one) is described as follows with reference to FIG. 5.

As shown in FIG. 5, at t1 an object with data to send to the host sends a [dataEvent] to the host and all other objects capable of sending messages to the host now must refrain from sending data events. When the host is ready to receive the data from the object which sent the data event at t1, it issues a {cmdevent at t2. The object addressed responds at t3 with a }cmdack which also contains some of the data it has to send. The host then requests at t4 that the object send the remainder of its data. The object sends the remainder of the data at t5 and the host acknowledges that all data was received at t5+n by sending a [dataAck]. All objects are now free to send a data event which is shown in Table1 at t5+m. The number of polled data packets between the data event at t1 and the data acknowledge at t5+n is variable depending on the timing of the system, the other tasks being handled by the host, and the amount of data the object needs to send. The system can also include timers which causes a retransmittal of the original data event if the host does not respond within a certain time and/or which clear any pending events so that the event generator can be re-enabled.

Another example of the event-reaction model (where the maximum number of pending data events is two) is described as follows with reference to FIG. 6.

As shown in FIG. 6, a first data generator sends a data event at t1 and a second data generator sends a data event at t2. Upon [dataEvent2, all data generators are prohibited from sending data events until a ]dataAck is generated. The host polls the first data generator for data at t3 and the first data generator responds to the host at t4, and sends the data. When all of the data is sent (which could require several {cmdEvents and }cmdAcks), complete receipt of the data is acknowledged at t5. All data generators are now free to send a data event. At t6 the host begins polling the second data generator. As seen in Table 2, before the second data generator responds, the first (or another) data generator sends another data event at t7. Again, with two pending events, all data generators are prohibited from sending additional data events. The second data generator sends its data at t8, the complete receipt of which is acknowledged at t9. Now with only a single data event pending in the host, all data generators are now free to send a data event.

This example assumes that the first and second data generators had equal priority. However, if the second data generator had priority over the first, the host would have polled it first. Optionally, the host may implement a time division multiplexing scheme to allow both data generators to send data "simultaneously". It will be appreciated that data generators which are prohibited from sending data are still permitted to perform local operations and that they may be provided with buffers to store locally generated data until the host permits them to send their data.

A presently preferred embodiment of a messaging language which supports the event-reaction has the following syntax: <array address|message type><object name><method/data type>(<data length><data> . . . <data>). The <> indicate bytes, the () are literal characters and the . . . shows that the number of data bytes may vary. The array address is five bits and for point to point communications, the array address is set to zero. The message type is three bits and presently six message types are defined. These include (1) exception, (2) data acknowledgement, (3) data event, (4) command acknowledgement, (5) polled response, and (6) command event. The object name is eight bits and is presently limited to ASCII characters @ through Z. The method/data type field is eight bits and is limited to ASCII characters a through z. This field is interpreted as a method when the message type is a command event or a command acknowledgement. There are presently five data types defined: (z) signed character, (y) unsigned character, (x) signed integer, (w) unsigned integer, and (v) floating point number. See, e.g., Appendix B, Globals.h, lines 2–35 and 55–69. The data length is eight bits and does not include the left and right parenthesis or the data length itself. The acknowledgement of commands is mandatory and the acknowledgement must echo the address fields of the command. The parsing of messages in this form is shown for example in Appendix B, Comms.c, lines 62–233.

There have been described and illustrated herein several embodiments of an event-reaction communication protocol in an object oriented processor array. While particular embodiments of the invention have been described, it is not intended that the invention be limited thereto, as it is intended that the invention be as broad in scope as the art will allow and that the specification be read likewise. Thus, while a particular microprocessor has been disclosed with reference to the presently preferred embodiment, it will be appreciated that other off-the-shelf or custom microprocessors could be utilized. Also, while specific software has been shown, it will be recognized that other software code could be used with similar results obtained.

From the foregoing, those skilled in the art will appreciate that the claims which follow are directed to a communications protocol which is particularly useful in a system of multiple processors which communicate with each other. Therefore, some of the claims are drafted with certain elements stated in "means plus function form". This is intended to convey that the inventor believes that there are many different software and hardware combinations which one of skill in the art could use to implement the inventive communications protocol described herein.

Thus, where it is said that an object oriented processor includes "means for sending a request to a host processor", those skilled in the art will appreciate that the hardware/software used to implement the means for sending a message will depend on what hardware/software is used to implement the host and the object oriented processor, as well as how the host and object oriented processor are coupled to each other. Therefore, this means for sending a request could include a UART, a parallel port controller, a SCSI port controller, or some other hardware device if the host and object oriented processor are coupled to each other by a serial link, a parallel link, or a SCSI link, or other hardware depending on the type of link. In addition, the hardware link controller will likely be controlled by the processor in response to software which provides the necessary commands to operate the hardware link controller and format messages to be transmitted by the hardware link controller. Moreover, the software which controls the link controller will be responsive to hardware or software which indicates that a request should be sent to the host. It will further be appreciated that in the realm of processor systems, many functions may be implemented in hardware or software or a combination of hardware and software. For example, as explained hereinabove, an entire system may be embodied "virtually" in software running on a single processor in which the objects and the host communicate via a virtual bus which does not require any hardware controllers and is entirely embodied by software.

In addition, where it is stated that the object oriented processors have "memory means for knowing a maximum permissible number of simultaneous pending requests", it will be appreciated that the size of such memory may be quite small depending on the maximum number permitted. Such a memory may be implemented with a simple counter as that term is known to refer to both hardware counters and software counters.

Where it is stated that each object oriented processor includes "monitoring means for monitoring communications with said host processor to determine a present number of pending requests", it will be understood that such monitoring means includes a means for seeing requests placed on the bus and that it need not monitor all communications between the host and other object oriented processors. Thus, such a monitor could be embodied as a filter coupled to the bus which shows the object oriented processor data events and acknowledgements, but filters other bus traffic from being considered by the object oriented processor. It will be appreciated that such a "filter" can be implemented in hardware (e.g. using gates, multiplexers, etc.) or in software (e.g. using conditional loops, etc.) or with a combination of hardware and software.

As explained above and claimed hereinbelow, the object oriented processors preferably include "means for incrementing the present number". Those skilled in the art will appreciate that such means may be implemented with counters, filters coupled to counters, conditional loops, registers controlled by conditional loops, etc.

Where it is stated that the host has "command means for commanding an object oriented processor to send a message", it will be understood that such means involves communications and decision making and thus may include a variety of hardware and/or software components. For example, where the host is a microprocessor and the object oriented processor is another microprocessor, this command means includes the communication port of the host and the software which decides when to send such a command and which controls communication port to send a message to the object oriented processor. Still, it will be understood that where the host and object oriented processor are embodied virtually with a single microprocessor, the command means does not need to include a communication port, but might use a variable set by software. Similarly, the host's "confirmation means" is structure which sends a particular message to an object oriented processor. This "confirmation means may, and probably should include many of the same components as the command means, but will send a different message, at a different time, than the command means does.

It will also be understood that the "means for decrementing" in the object oriented processors may include some of the same circuitry as the means for incrementing or may include similar software commands which differ only in sign.

Finally, the "priority memory means" in the host processor is either hardware or software which enables the host to identify a request as coming from a particular object oriented processor and which enables the host to associate that request with a priority level. As such it may be embodied as a simple filter or set of filters. It could also be a database which is queried by the program running on the host.

It will therefore be appreciated by those skilled in the art that yet other modifications could be made to the provided invention without deviating from its spirit and scope as so claimed.

I claim:

1. A method of arbitrating communications between a plurality of message sources and a message target, said method comprising:
   a) establishing a maximum number of allowed pending messages;
   b) informing each of the sources what said maximum number is;
   c) each source monitoring communications with the target to determine a present number of pending messages;
   d) no source sending a message to the target unless the present number is less than the maximum number;
   e) each source starting a message to the target by sending a request to the target;
   f) the present number being incremented each time a request is sent to the target;
   g) the target responding to a request by a requesting source by commanding the requesting source to send a message;
   h) the target confirming receipt of each message sent to it; and
   i) the present number being decremented each time the target confirms receipt of a message.

2. A method according to claim 1, further comprising:
   j) assigning priorities to at least some of the message sources;
   k) informing the target of the assigned priorities; and
   l) the target responding to multiple pending requests by sources with different priorities by commanding the source with the higher priority to send a message.

3. An object oriented processor system, comprising:
   a) a host processor; and
   b) a plurality of object oriented processors coupled to said host processor, at least some of said object oriented processors generating data in response to events, each of said data generating object oriented processors includes request means for sending a request to said host processor, memory means for knowing a maximum permissible number of simultaneous pending requests, and monitoring means for monitoring communications with said host processor to determine a present number of pending requests, wherein i) each of said data generating object oriented processors sends a request to said host processor before data can be sent to said host processor;
   ii) each of said data generating object oriented processors is aware of a maximum permissible number of simultaneous pending requests;
   iii) each of said data generating object oriented processors monitors communications with said host processor to determine a present number of pending requests;
   iv) none of said data generating object oriented processors sends a request to said host processor unless the present number is less than the maximum number.

4. An object oriented processor system according to claim 3, wherein:
   each of said data generating object oriented processors includes means for incrementing the present number, and said host porcessor includes command means for commanding an object oriented processor to send a message, wherein
   v) the present number is incremented each time a request is sent to said host processor; and
   vi) said host processor responds to a request by commanding the requesting object oriented processor to send a message.

5. An object oriented processor system according to claim 4, wherein:
   said host processor includes confirmation means for confirming receipt of messages sent to said host processor, and each of said data generating object oriented processors includes means for decrementing the present number, wherein
   vii) said host processor confirms receipt of each message sent to it; and
   viii) the present number is decremented each time said host processor confirms receipt of a message.

6. An object oriented processor system according to claim 5, wherein:
   said host processor has priority memory means for associating at least some of said data generating object oriented processors with different priorities, wherein
   ix) at least some of said data generating object oriented processors have assigned priorities;
   x) said host processor is aware of the assigned priorities; and
   xi) said host processor responds to multiple pending requests by data generating object oriented processors with different priorities by commanding the data generating object oriented processor with the higher priority to send a message.

7. An object oriented processor system, comprising:
   a) a host processor; and
   b) a plurality of object oriented processors coupled to said host processor, at least some of said object oriented processors generating data in response to events, each of said data generating object oriented processors includes a request generator, memory, and a communications monitor, wherein
   i) each of said data generating object oriented processors sends a request via said request generator to said host processor before data can be sent to said host processor;
   ii) said memory of each of said data generating object oriented processors contains an indication of a maximum permissible number of simultaneous pending requests;

iii) each of said data generating object oriented processors monitors communications with said host processor via said communications monitor to determine a present number of pending requests;

iv) none of said data generating object oriented processors sends a request to said host processor unless the present number is less than the maximum number.

8. An object oriented processor system according to claim 7, wherein:

each of said data generating object oriented processors includes a present number incrementer coupled to said memory and said communications monitor, and said host processor includes a command message generator, wherein v) each of said present number incrementers increments the present number each time said communications monitor indicates that a request is sent to said host processor; and vi) said host processor responds to a request by sending a command message via said command message generator to the requesting object oriented processor instructing the requesting object oriented processor to send a message.

9. An object oriented processor system according to claim 8, wherein:

said host processor includes a confirmation message generator, and each of said data generating object oriented processors includes a present number decrementer coupled to said memory and said communications monitor, wherein vii) said host processor confirms receipt of each message sent to it by sending a confirmation message via said confirmation message generator; and viii) each of said present number decrementers decrements the present number each time said communications monitor indicates that said host processor confirms receipt of a message.

10. An object oriented processor system according to claim 9, wherein:

said host processor has a priority memory, wherein ix) at least some of said data generating object oriented processors have assigned priorities stored in said priority memory;

x) said host processor responds to multiple pending requests by data generating object oriented processors with different priorities by commanding the data generating object oriented processor with the higher priority to send a message.

* * * * *